United States Patent
Tan

(10) Patent No.: US 6,810,887 B2
(45) Date of Patent: Nov. 2, 2004

(54) METHOD FOR CLEANING SEMICONDUCTOR FABRICATION EQUIPMENT PARTS

(75) Inventor: Samantha Tan, Union City, CA (US)

(73) Assignee: Chemtrace Corporation, Fremont, CA (US)

( * ) Notice: Subject to any disclaimer, the term of this patent is extended or adjusted under 35 U.S.C. 154(b) by 0 days.

(21) Appl. No.: 09/927,263

(22) Filed: Aug. 10, 2001

(65) Prior Publication Data

US 2004/0045574 A1 Mar. 11, 2004

Related U.S. Application Data

(60) Provisional application No. 60/224,582, filed on Aug. 11, 2000.

(51) Int. Cl.[7] .............................. B08B 3/04; B08B 3/08; B08B 3/10; B08B 3/12
(52) U.S. Cl. .............................. 134/1.3; 134/2; 134/3; 134/18; 134/19; 134/26; 134/902
(58) Field of Search .......................... 134/1, 1.3, 2, 3, 134/18, 19, 26, 902

(56) References Cited

U.S. PATENT DOCUMENTS 5,258,093 A 11/1993 Maniar
5,975,097 A 11/1999 Yonemizu et al.
6,607,605 B2 * 8/2003 Tan .............................. 134/3

* cited by examiner

Primary Examiner—Zeinab El-Arini
(74) Attorney, Agent, or Firm—Perkins Coie LLP

(57) ABSTRACT

A process for cleaning semiconductor fabrication equipment parts includes determining a definition for a clean part including multiple maximum acceptable impurity levels; determining an initial multiple impurity levels of a part prior to its cleaning; determining a cleaning process to apply to the part; applying the cleaning process to the part, wherein the cleaning process creates reduced multiple impurity levels for the part below that of the initial multiple impurity levels; determining the reduced multiple impurity levels; comparing the reduced multiple impurity levels against the multiple maximum acceptable impurities levels of the definition; and repeating the application of the cleaning process to the part if the reduced multiple impurity levels do not meet the definition of a clean part. A dilute aqueous cleaning solution for cleaning parts includes 0.5–1.5% wt. HF; 0.1–0.5% wt. $HNO_3$; and 1–10% wt $H_2O_2$. A method for reducing sub-surface damage to a part includes determining how deep is the sub-surface damage beneath a surface of a part; chemically etching said surface of said part; and stopping said chemical etching of said surface at about said depth of said sub-surface damage.

21 Claims, 9 Drawing Sheets

METHOD FOR CLEANING SEMICONDUCTOR FABRICATION EQUIPMENT PARTS

CROSS REFERENCE TO RELATED APPLICATIONS

This application claims the benefit of provisional application U.S. Serial No. 60/224/582, filed on Aug. 11, 2000, entitled "System and Method for Cleaning Semiconductor Fabrication Equipment Parts", incorporated herein by reference.

BACKGROUND OF THE INVENTION

The commercial fabrication of semiconductor chips is performed on silicon wafer substrates, which are typically four to twelve inches in diameter. There are often more than 100 processing steps in the fabrication of semiconductor chips including oxidation, diffusion, ion implantation, deposition of conductors and insulators, photolithography, and etching. Various conducting and insulating layers are deposited uniformly over the wafer to a thickness of a few microns.

In critical applications, certain new parts of semiconductor processing equipment need to be cleaned prior to installation and use in order to remove residual contamination from the machining or manufacturing process in order to achieve levels of cleanliness similar to the semiconductor wafer itself. Furthermore, after many wafers have been processed, the equipment used in the semiconductor processing process becomes contaminated, and therefore unusable. For example, in an etching machine, polymer deposits on the outer circumference of electrodes or chucks supporting the wafers until it becomes thick enough to interfere with the wafer's contact with the electrode. This results in non-uniform etching across the wafer as well as missed transfers due to a wafer sticking to polymer buildup on the electrode. Non-uniformity exceeding seven percent is beyond some specified limits, in turn affecting side wall profile variance across the wafer. In addition, other components in the equipment chamber e.g. roofs/domes and liners are also coated with polymers and contaminants which contribute particles, metallic and organic impurities to the wafers. Therefore, it is then necessary to disassemble the parts in the equipment chamber and clean the individual parts.

Generally, semiconductor manufacturing plants employ specialized cleaning houses to have the semiconductor processing equipment parts cleaned. These cleaning houses typically clean the equipment by following "recipes," given to them by the manufacture of the equipment. These recipes generally include information informing the cleaning house how to clean the parts. Since, there are many variations to the wafer processes, the polymer and contamination levels of a used chamber part is different, therefore, merely following one cleaning recipe does not always result in the part being cleaned. In addition, after following the cleaning recipe, a conventional cleaning house generally will not test the parts to ensure its cleanliness. In general, a conventional cleaning house has no idea as to the effectiveness of the cleaning process provided to them in the recipe.

The result of following cleaning recipes in this manner, is that many semiconductor parts are returned to the semiconductor manufacturing plant still contaminated with unacceptable levels of impurities. This results in contamination that may be transferred onto a wafer typically in the form of high particle counts, or in inoperable equipment that must again be disassembled for re-cleaning, thus further increasing the down time for the equipment.

In view of the forgoing, what is needed are methods and systems for enhanced cleaning and certification of semiconductor fabrication equipment. The methods should be flexible, and consistent enough to minimize or eliminate contamination from the equipment, to improve the mean time between cleanings (MTBC), to improve the number of RF hours run on a chamber set of parts and to reduce the downtime experienced by most semiconductor fabrication equipment.

With the ability to test and verify the effectiveness of cleaning procedures, new cleaning methods can be developed for critical chamber parts. Critical chamber parts are usually constructed from base materials such as ceramics ($Al_2O_3$, SiC, AlN) and quartz ($SiO_2$). Chamber parts manufactured from these base materials are very expensive and are selected because of they are non-contaminating with respect to metallics, organics and particles. With new cleaning methods, these critical chamber parts can be effectively cleaned and recycled to reduce manufacturing cost.

Typically, in the prior art, relatively high concentrations of acids and other cleaning agents were used to clean parts. For example, a typical acid bath for quartz cleaning would include 1 part HF, 1 part $HNO_3$, and 1 part $H_2O$. Unfortunately, such high concentration solutions suffer from a number of drawbacks. For one, they can damage the surface of part being cleaned by scoring, etching, pitting, etc. Further, these high concentration solutions tend to be expensive, hazardous, and difficult to dispose of.

SUMMARY OF THE INVENTION

The present invention addresses these needs by providing a process for enhanced semiconductor fabrication equipment and parts cleaning. In one embodiment, a definition is determined that defines the characteristics for a clean part. Next, a part to be cleaned is tested to determine its incoming impurity levels. A cleaning process is then determined that is capable of reducing the incoming impurity levels for a particular part, depending on the type of base material the part is made from, the deposits on the part, and characteristics of adhesion, particle generation and reactivity. The appropriate cleaning process is then applied to the part so that it reduces the incoming level of impurities on the part, and tested to ensure that the part is clean. There are various types of impurities, but typically they fall into the categories of metals, particles, and organic organics.

Advantageously, one embodiment of the present invention reduces the cleaning defects by use of repeated testing of the impurity levels after each pass through the cleaning process. Moreover, by knowing the characteristics of a clean part through testing, the process of the present invention can achieve particular impurity level goals with increased accuracy, and the part can be certified to meet an actual specification based on either the need for cleanliness in the semiconductor process, or based on statistically significant test data. Finally, the process may be continuously optimized to further enhance the cleaning process by direct testing of the cleanliness of the part, by correlating to number of "added" particles and RF hours that the parts can be used before particles increase to unacceptable limits, and ultimately by correlating to improved wafer yield.

Using the dual concepts of in-process testing of the cleanliness of a part for improved cleaning performance, and testing the cleaned part after the final cleaning, a cleaning method can be customized, optimized, and validated for each critical part.

Advantageously, dilute chemistries can be used in preferred embodiments of the present invention. This makes the cleaning process less expensive. Used chemicals are also easier to dispose of because the percentage of acids is much lower which also in turn makes it less hazardous. Additionally, there is less damage to the product. The present invention further includes methodologies to determine optimal chemistries which are effective, yet dilute.

These and other advantages of the present invention will become apparent upon a study of the following descriptions and related drawings.

Figure 1A:
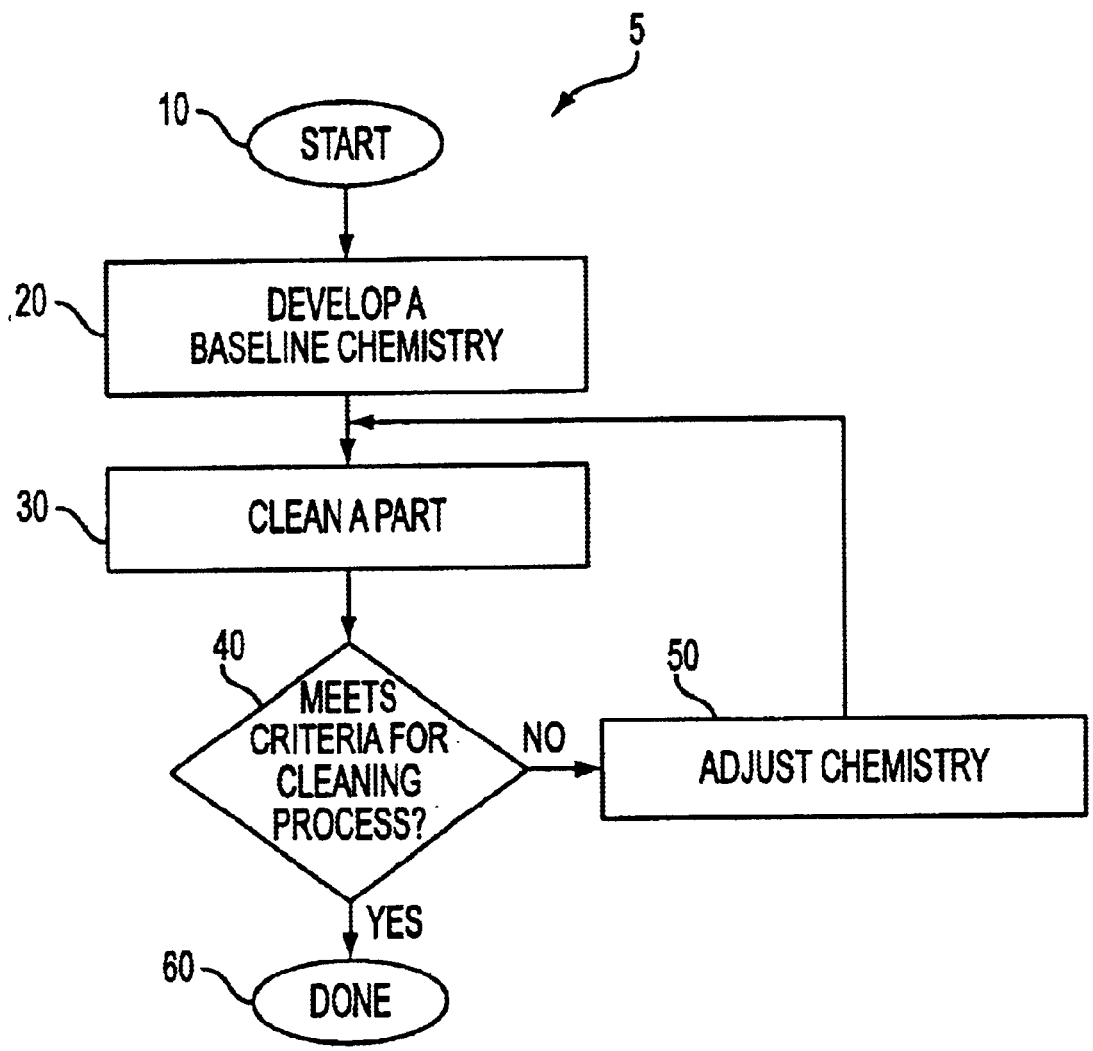
FIG. 1A is a flowchart showing a general process guideline for cleaning semiconductor fabrication equipment parts.

The invention, together with further advantages thereof, may best be understood by reference to the following description taken in conjunction with the accompanying drawings.

DETAILED DESCRIPTION OF THE INVENTION

An invention is described herein for cleaning semiconductor equipment parts (such as CVD and etch chamber parts) that achieve increased effectiveness in impurity removal. In the following description, numerous specific details are set forth in order to provide a thorough understanding of the present invention. It will be apparent, however, to those skilled in the art, that the present invention may be practiced without some or all of these specific details. In other instances, well known process steps have not been described in detail in order not to unnecessarily obscure the present invention. In particular, this includes most of the analytical testing methods used to measure or confirm impurity levels.

In accordance with one aspect of the present invention, the aforementioned metallic impurity removal is substantially enhanced by the use of a new chemical formula in the various cleaning processes. This cleaning formula is particularly novel as applied to the cleaning of polysilicon, quartz, and ceramic parts ($Al_2O_3$, SiC and AlN) for which it has proven to be quite effective. Specifically, the cleaning formula is a composition of high purity hydrofluoric acid (HF), nitric acid ($HNO_3$), and hydrogen peroxide ($H_2O_2$), in very dilute quantities. Preferably, the composition includes 0.5–1.5% wt. HF, 0.1–0.5% wt. $HNO_3$, and 1–10% wt. $H_2O_2$. This particular formula results in a particularly efficient collector of metals on certain materials as described in greater detail subsequently. This high purity cleaning and collection solution has been shown to have very high recoveries and efficiencies, especially on single crystal silicon wafer surfaces, high purity quartz, polysilicon, and ceramics. Previously, these materials were cleaned with concentrated chemicals mixtures of HF/$HNO_3$, and HCl/$HNO_3$ at much higher concentration of 10%–40% wt for each chemical. The chemical $H_2O_2$ is not employed in these mixtures. The high concentrations of the chemical mixtures did not improve metallic removal and can severely etched and damaged the base materials. It is shown that the high purity dilute chemical formula in this invention is highly effective in removing metallic contaminants and will not etch any of the aforementioned base materials for more than a few hundred angstroms.

It will therefore be appreciated that a dilute aqueous cleaning solution for parts can be made up of 0.5–1.5% wt. HF, 0.1–0.5% wt. $HNO_3$ and 1–10% wt $H_2O_2$. The concentration of $H_2O_2$ can also be no greater than about 5% wt.

Metallic contaminants form bonds with the surfaces of the semiconductor fabrication equipment parts, thus bonding the metal impurities to the surfaces of the equipment. These chemical bonds create increased difficulty in cleaning the parts without the use of correct chemical formulations. If the chemical formulations are too concentrated, the semiconductor equipment parts can be irreversibly destroyed or are not sufficiently cleaned.

The chemical formula of the present invention substantially enhances the cleaning process by breaking the chemical bonds and thereafter collecting the metal impurities. To elaborate further, the hydrofluoric acid breaks silicon and aluminum bonds by dissolving the silicon and aluminum oxides of the surface of the semiconductor equipment. This frees the metal impurities and allows them to be collected in the cleaning solution. It should be borne in mind that the amount of hydrofluoric acid must be carefully controlled, as too much hydrofluoric acid results in damage to the surface of the equipment parts. The use of HF is critical in semiconductor parts cleaning because silicon and aluminum oxides are prevalent impurities in all types of parts.

The hydrogen peroxide is a strong oxidizer and is used to convert the metals such as Cu, Au and Ag into the soluble forms. Therefore, the presence of $H_2O_2$ greatly increases the range of metal impurities that can be removed from a surface.

Finally nitric acid is used to stabilize and increase the solubility of some metal impurities so that insoluble fluorides of Ca and Mg are kept in the solution and away from the surface of the semiconductor equipment parts. In this technique, it is preferable to have the solution as dilute as possible, yet still effective to clean the equipment parts to predefined specifications. The above mentioned ranges are thus the preferred minimums needed to clean the equipment.

The chemical formula of the present invention is used to perform various cleaning processes for semiconductor equipment parts and other high purity material applications. In one embodiment, this formula has been shown to be quite effective in cleaning metal ions from high purity quartz, as is commonly found as rods, tubes, crucibles, domes, chambers and bell jars. In another embodiment, this formula has been shown to be quite effective in cleaning metal ions from high purity polysilicon and single crystal silicon surface, as is commonly found in chamber roofs, source rings, collars and wafers respectively. In another embodiment, this formula has been shown to be quite effective in cleaning metal ions from high purity ceramic materials $Al_2O_3$ as found in chamber domes, bell jars, rings, gas nozzle assemblies and wafer chucks; SiC as found in chamber roofs, domes, rings and collars; and AlN as is commonly found in wafer chucks.

In accordance with another aspect of the present invention, the aforementioned particle impurities are removed from the semiconductor equipment surface by chemical treatments. Most semiconductor equipment parts fabricated from the aforementioned critical base materials are textured by grit blasting in order to improve process polymer adhesion. After machining and texturing, the parts are cleaned to remove particles. There are two categories of particles on the textured surface. The first type is surface particles that are loosely adhering. These particles can be removed physically by a short ultrasonication step. The origin of the second category of particles is less obvious. These particles originated from the weakened base material surface caused by texturing. In the process chamber, subsurface damages are often exaggerated during wafer processing causing particle shedding.

The chemical formula of the present invention significantly reduces the particles from textured equipment parts by etching off a layer of damaged base materials without affecting the desired surface roughness. First, the depth of the subsurface damage is determined using any one of a number of well-known techniques. Using concentrated basic solutions such as 10–30% wt KOH and NaOH in water, base materials such as polysilicon base materials can be etched off to a predetermined depth (i.e. to about the depth of the measures subsurface damage) by controlling temperature and time to remove all the sub-surface damages. Using concentrated acidic solutions such as $H_2SO_4/H_2O_2$ and $H_2SO_4/H_3PO_4$ in the range of 10–50% wt for each chemical, ceramic materials ($Al_2O_3$, SiC and AlN) can be etched off to a predetermined depth by controlling temperature and time to removed all the sub-surface damages. In another application with quartz, the use of $HF/HNO_3$, 20–40% wt for each chemical in water, used with ultrasonic energy (27–120 kHz) for 10–20 mins is found to effectively etched off damaged quartz material resulting from grit-blasting and particle counts can thereby be drastically decreased.

In accordance with another aspect of the present invention, the aforementioned organic polymer deposited on semiconductor equipment surface during wafer processing can be removed from all type of critical materials surface by a thermal decomposition step. Organic polymers are often found in etch equipment parts. These organic polymers can be efficiently removed by submitting dirty quartz and $Al_2O_3$ parts to a high temperature of 600–800° C. for 1–10 hours depending on how thick or resistance the organic polymer to cleaning. A high temperature muffle furnace is used for this purpose.

In another embodiment, disassembled semiconductor fabrication equipment parts are subjected to cleaning processes and testing to achieve enhanced impurity removal, as described in greater detail subsequently.

FIG. 1A is a flowchart showing a general process guideline 5 for cleaning semiconductor fabrication equipment parts. The process starts at operation 10 and proceeds to operation 20 where a baseline chemistry is developed for cleaning the part. In operation 30, the part is cleaned with the baseline chemistry. In operation 40, the effectiveness of the cleaning process is tested. If it is not sufficient, operation 50 is performed where the chemistry is adjusted to improve the cleaning ability and the part is re-cleaned at operation 30. If the first cleaning was effective, the process ends at operation 60.

In operation 50, the chemistry can be adjusted in various ways. For example, the chemistry can be changed by adding or deleting acids, oxidizers, etc. It can also be adjusted by increasing the concentration of the solution, or by making the solution more dilute. The purpose of operation 50 is, therefore, to optimize the chemistry to provide the most effective, least damaging, most economical, and least hazardous solution to cleaning the part.

Figure 1B:
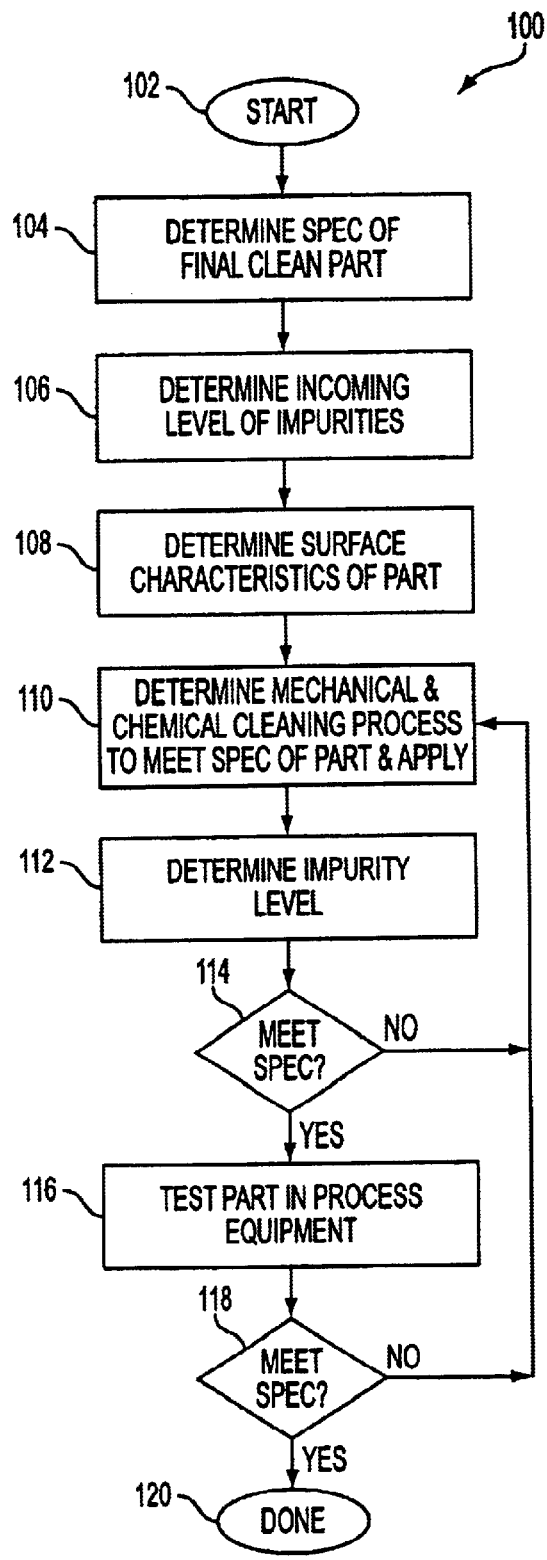
FIG. 1B is a flowchart showing a process for cleaning semiconductor fabrication equipment parts, for example high purity quartz, in accordance with an embodiment of the present invention.

FIG. 1B is a flowchart showing a process 100 for cleaning semiconductor fabrication equipment parts, for example high purity quartz, in accordance with an embodiment of the present invention. In an initial operation 102, pre-process operations are performed. Pre-process operations include preparing and testing facility configurations and other pre-process operations that will be apparent to those skilled in the art. In particular, pre-process operations can include establishing environmental controls (e.g. particles and metals in the environment), qualifying RO/DI high purity water, establishing "new" handling protocols, and setting up fixturing process.

In a specification operation 104, the specification for what constitutes a clean part is determined. As indicated previously, conventional cleaning houses generally follow a recipe given to them by a manufacturer. For example, a cleaning recipe from a manufacturer may include rinsing a part in deionized water, immersing it in a particular chemical mixture, etc. In the present invention, instead of merely following a cleaning recipe, a specification for a clean part is determined. The specification characterizes what the minimum parameters are for a particular part to be considered clean enough to achieve the required wafer performance.

A specification may be obtained from another party, such as the party owning the part to be cleaned, or the specification may be determined by testing. There are three ways to create a specification through testing. In the first approach a part is first obtained that is already known to be clean, i.e., has the minimum parameters to be considered clean, for example a new part. The part is then tested and characterized with respect to particles, metals, organics, or any combination thereof. When characterizing with respect to particles, the surface of the part is examined with respect to particles using several different analytical techniques which may include the Dryden QIII surface particle counter, a liquid particle counter (LPC), or Scanning Electron Microscopy (SEM) or SEM with Energy Dispersive X-ray detection (SEM/EDX). When characterizing with respect to metals, the surface is examined through sophisticated analytical chemistry testing methods with respect to surface metal contamination, bulk metal contamination, or both. When examining the part with respect to bulk metal contamination, a portion of the material is digested in a solution to measure the impurities within the material. With respect to surface metal contamination, metals are extracted from the surface, normalized to the surface area, and measured by spectroscopic techniques such as inductively coupled plasma-mass spectrometry (ICP-MS). When characterizing the part with respect to organics, surface extractions may be made using DI and solvents that are then analyzed by a total organic carbon analyzer (TOC) and Gas Chromatography (GC) or Gas Chromatography with Mass Spectrometry (GCMS) respectively. Alternately or additionally, the entire material may be outgassed at a high temperature with the resulting gasses being analyzed by dynamic head space GC-MS or ATD GC-MS.

In the second approach, new or used parts are cleaned using the best known cleaning methods based on historical or theoretical considerations. After the cleaning process is applied, the part is tested for impurities. The part is then assembled into the semiconductor process equipment and chamber process data is collected. Process data may include 1) particles added ("adders") to a silicon wafer surface after being in contact with the process equipment containing the clean part; 2) metal impurities transferred onto a silicon wafer surface after being processed in the semiconductor equipment containing the clean part; 3) mean number of wafers between cleanings; etc. Such chamber process data can then be correlated to analytical impurity test data from the cleaned part itself. In this way cleaning methods and formulas can be developed or improved based on the correlation between the test data from the analytical impurity testing on the part and the data generated after running a wafer in the process chamber. Moreover, a specification can be set after evaluation of the chamber process performance parameters.

In the third approach, specifications can be set by collecting impurity test data on a statistically significant number of parts that has proven to perform well in the semiconductor process. Control limits can also be established by collecting test data on a statistically significant number of parts.

Next, in an operation 106, the incoming impurity level for the part is determined. In this operation, a part is tested to determine the current impurity level of the part with respect to metals, particles, or organics. For particles, this determination is made by performing either a surface particle test or a liquid particle count test, as described in greater detail subsequently. Depending on the type of test utilized to determine the particle level, the particle impurities are described as either particles per $cm^2$ or particles per volume of solution. The incoming trace metal impurities are typically measured using acid extraction ICP-MS technique, the metallic levels are described as atoms/$cm^2$ or ng/$cm^2$. The incoming impurity levels for organics are measured using GC, GCMS, or ATD GCMS and the organic levels are described as atoms/$cm^2$ or ng/$cm^2$ for trace concentration or % surface concentration for major concentration. SEM/EDX maybe used semi-quantitatively for the determining of major elements such as those present in the process polymers, the elements being C, F, Cl, Al Si and O.

In a surface determination operation 108, the surface of the part is characterized. Generally, this operation determines the characteristics of the material. These characteristics include the desired surface finish as well as surface roughness.

Referring next to operation 110, a mechanical and chemical process that will meet the clean specification of the part is determined. Depending on the material, size, condition, and specification of the part being cleaned, a mechanical and chemical process is determined that will clean the part to the predefined clean specification of operation 104. For example, a process for cleaning a quartz part is disclosed subsequently. Once determined, the chemical and/or mechanical processes are applied to the part.

After cleaning, the part is again tested to determine the impurity level of the part, in operation 112. This operation is performed much the same as operation 106, the difference being that operation 112 is carried out after the part is cleaned.

A determination is then made as to whether the clean specification has been met, in operation 114. Essentially, the results of the impurity level determination operation 112 are compared to the specification, determined in operation 104. If the specification has been met, the process continues with an equipment testing operation 116. However, if the specification is not met, the process continues with another process determination operation 110.

Thus, the present invention, with respect to metal impurities, utilizes a sequential approach to cleaning semiconductor equipment parts. In this manner, the cleaning process is repeated until the impurity level is brought down to an acceptable level. Essentially, the impurity levels are brought down by orders of magnitude in a stepwise fashion. In addition, the cleaning processes can be optimized with each pass through the process, based on the measurement of the impurity levels.

In an equipment test operation 116, the clean equipment part is installed and operated with the process for manufacturing semiconductor devices and the wafers are measured for contaminants after being run in the process as an indication of the purity of the materials in the chamber. Particularly, the number of particles added to the wafer after running the process and the impurities on the wafers are considered indicies.

A decision is then made as to whether the part functions properly in its related equipment, in operation 118. If the part functions properly, the process is completed in a finishing operation 120. Otherwise, the process continues with another process determination operation 110.

Finally, in a finishing operation 120, the cleaning process is completed and the cleaned part may be put back into production. Advantageously, the present invention reduces cleaning defects by repeated testing of the impurity levels after each pass through the cleaning process. Moreover, by knowing the characteristics of a clean part, the process of the present invention can achieve specified results with increased accuracy. Finally, the cleaning process may by continuously optimized to achieve a cleaning process that cleans close to 100% of the parts from a particular process.

An important feature of the present invention is the use of analytical testing. As described previously, conventional cleaning is done with little or no testing of the part itself. The most testing typically done in conventional cleaning is testing of the resistivity of the rinse water used in a conventional cleaning process or of the concentrations of the acid baths. In contrast, the present invention consistently test the impurity levels of the semiconductor parts after being cleaned, as described in greater detail with respect to FIG. 3.

In view of the foregoing, it will be appreciated that a process for cleaning semiconductor fabrication equipment parts includes determining a definition for a clean part including multiple maximum acceptable impurity levels, determining an initial multiple impurity levels of a part prior to its cleaning, determining a cleaning process to apply to the part, applying the cleaning process to the part, wherein the cleaning process creates reduced multiple impurity levels for the part below that of the initial multiple impurity levels, determining the reduced multiple impurity levels, comparing the reduced multiple impurity levels against the multiple maximum acceptable impurities levels of said definition, and repeating the application of the cleaning process to the part if said reduced multiple impurity levels do not meet the definition of a clean part.

The process can also include testing the part in reassembled equipment in which the part was designed to operate and repeating a cleaning process on the part if the part does not function properly in the reassembled equipment.

Also the process can include at least one impurity level which is determined utilizing a surface particle test. The impurity level can also be determined by using a liquid particle test. Also, one or more impurity levels can be determined by using acid-extraction ICP-MS technique.

Figure 2:
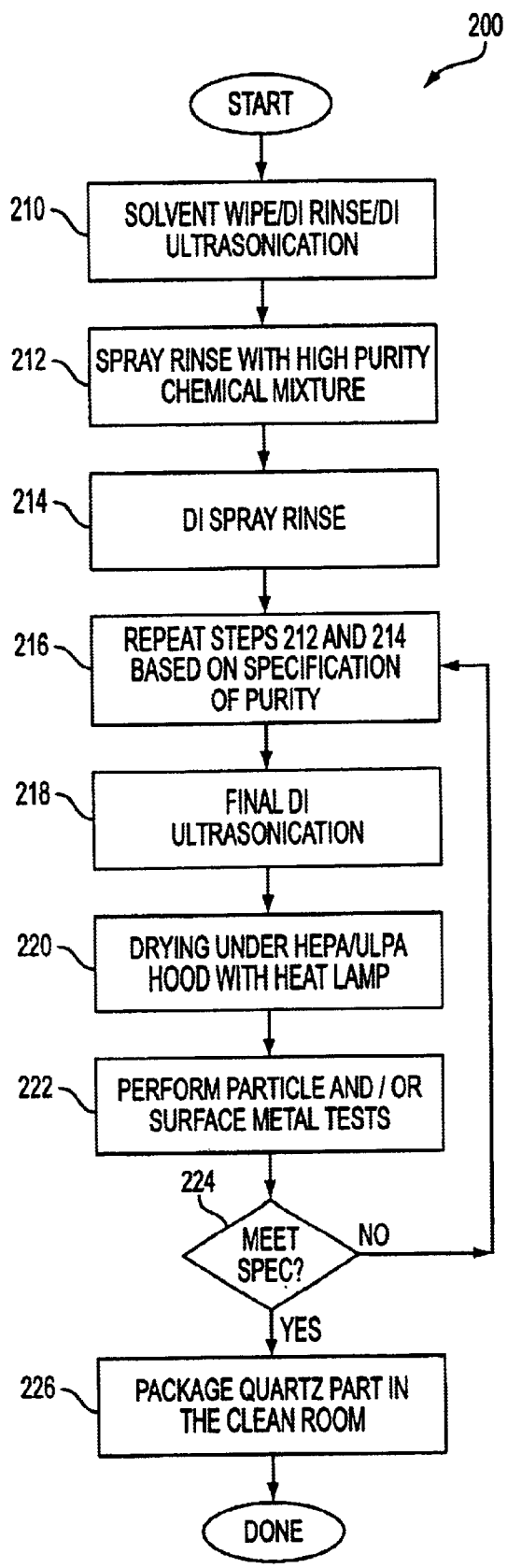
FIG. 2 is a flowchart showing a process for cleaning high purity quartz in accordance with another embodiment of the present invention.

FIG. 2 is a flowchart showing a process for cleaning high purity quartz in accordance with another embodiment of the present invention. FIG. 2 shows a process 200 that progresses through the following acts or operations. In 210 the part is degreased with solvents such as IPA/acetone and is sprayed rinse with DI water or alternately ultrasonicated in DI water. In 212 the part is cleaned by either a spray or squirt rinse with the aforementioned high purity cleaning formula. In 214 the cleaning solution used in 212 is discarded. In 216 the acts or operations of 212 and 214 are repeated, where the number of repeats is a function of specification level of purity. In 218 another DI water ultrasonication and spray rinse of the quartz part is performed. In 220 the part is allowed to dry under heat lamps within a controlled HEPA/ULPA filtration cleanhood located in a cleanroom. In 222 testing is performed for surface metals and/or surface particles. In 224 impurity data is collected. And in 226 the quartz part is packaged in a cleanroom or similar controlled environment.

It will therefore be appreciated that a method for reducing sub-surface damage to a part includes determining how deep is the sub-surface damage beneath a surface of a part, chemically etching the surface of the part and stopping the chemical etching of the surface at about the depth of the sub-surface damage.

Also, a method for cleaning a part includes performing an ultrasonication cleaning process to a surface of a part to be cleaned, spray rinsing the part with a dilute chemical mixture and spray rinsing the part with deionized water. The method can also include repeating the spray rinsing of the part with a dilute chemical mixture and spray rinsing the part with deionized water based upon the specification of purity for the part.

Figure 3:
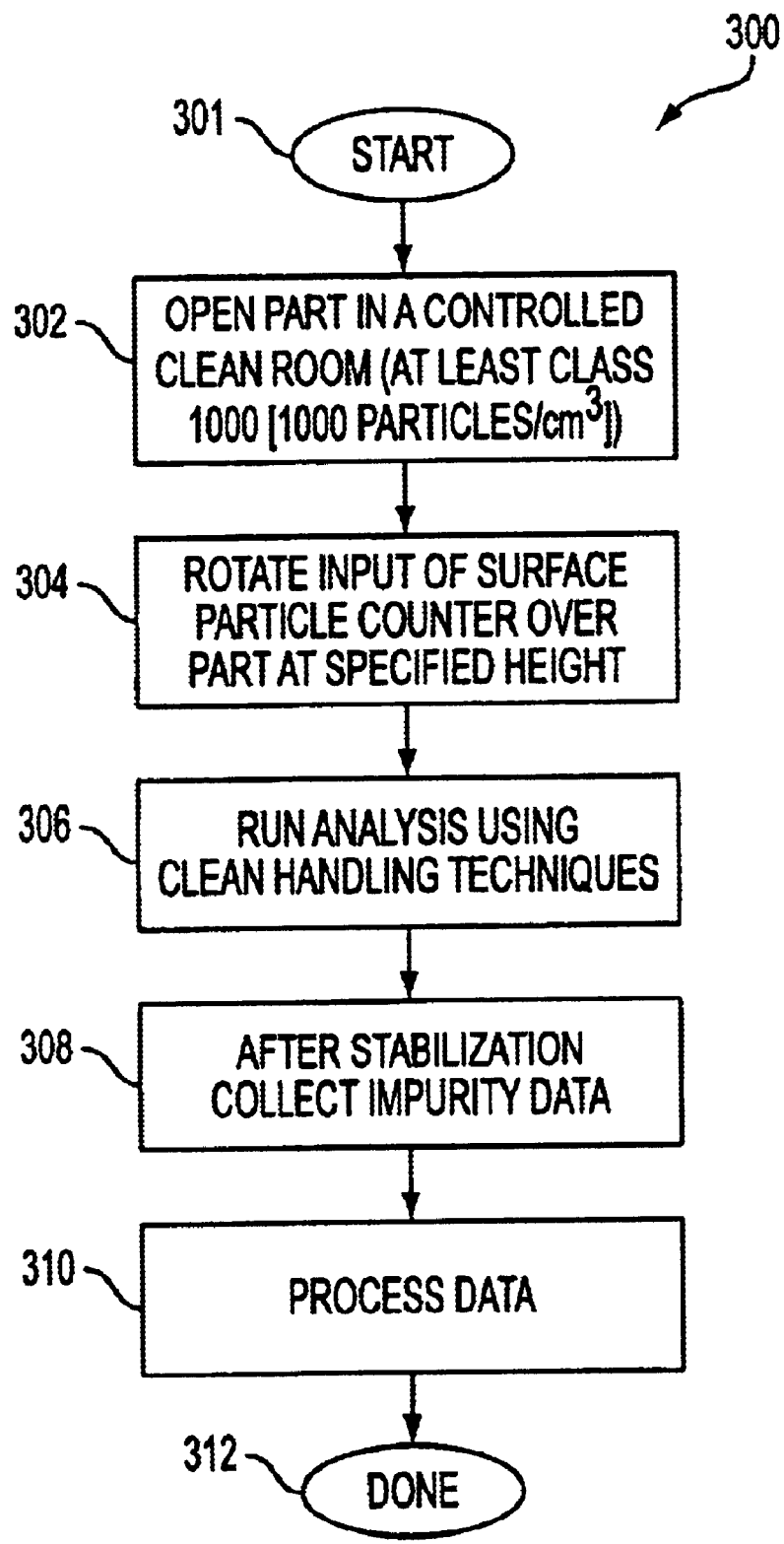
FIG. 3 is a flowchart showing a surface particle test process for impurity level testing of a new or clean part, in accordance with one embodiment of the present invention.

FIG. 3 is a flowchart showing a surface particle test process 300 for impurity level testing of a new or clean part, in accordance with one embodiment of the present invention. In an initial operation 301, pre-process operations are performed. Pre-process operations include determining the specification of characteristics for a clean part, and other pre-process operations that will be apparent to those skilled in the art. This process is applicable, for example, to operations 106 and 112 of FIG. 1.

Next, in a cleanroom operation 302, the semiconductor equipment part to be measured is opened in a class 1000 cleanroom or better (1000 particles per cubic centimeter). Upon being disassembled, semiconductor equipment part is packaged for delivery to the cleaning center. To avoid further contamination of a new or clean part, it is preferable to open the part in a controlled clean environment. In 304 the input of the particle counter is scanned over the part over a specified distant. In 306 an analysis of the part is begun using clean handling techniques. In 308 impurity data is collected after stabilization, and in 310 the data is processed. The process is completed in 312.

Figure 4:
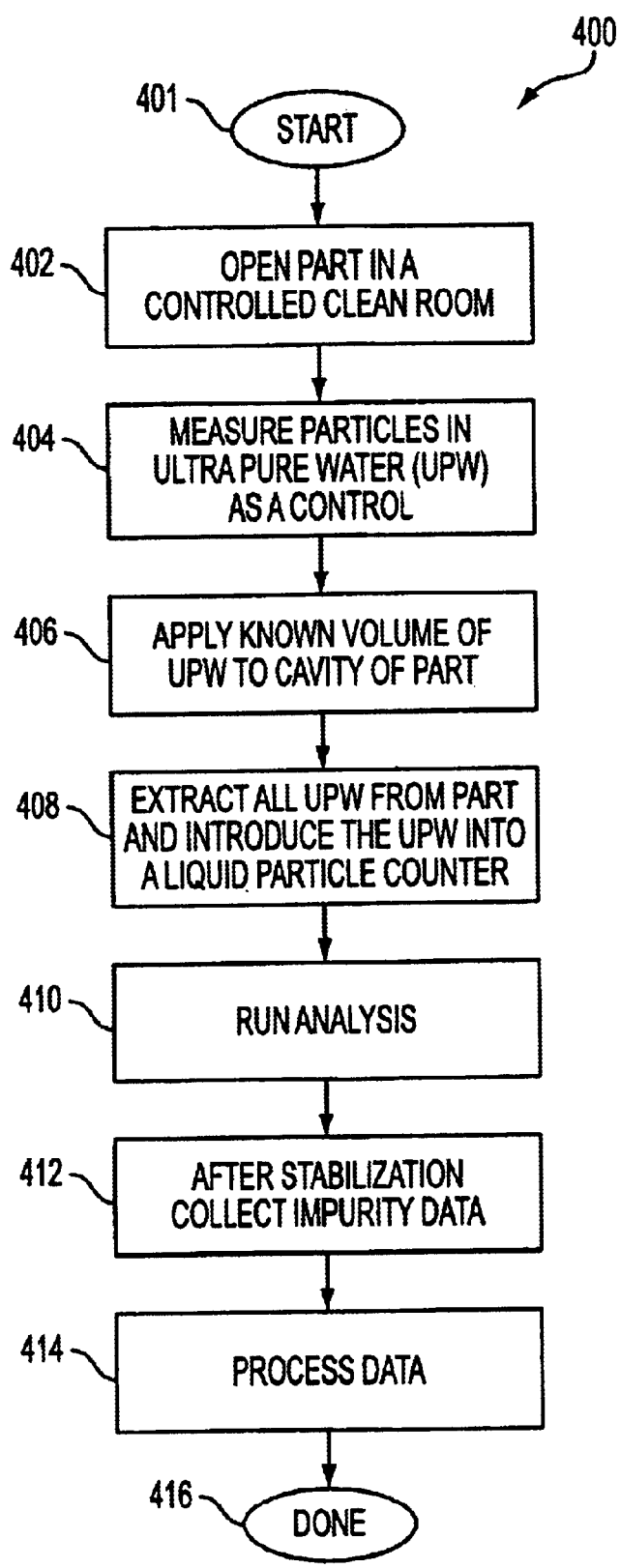
FIG. 4 is a flowchart showing a liquid particle test process of a new or clean part, in accordance with an embodiment of the present invention.

FIG. 4 is a flowchart showing a liquid particle test 400 of a new or clean part, in accordance with an embodiment of the present invention. In an initial operation 401, pre-process operations are performed. Pre-process operations include determining the specification of characteristics for a clean part, and other pre-process operations that will be apparent to those skilled in the art. This process is applicable, for example, to operations 106 and 112 of FIG. 1.

Next, in a cleanroom operation 402, the semiconductor equipment part to be cleaned is opened in a cleanroom. Upon being disassembled, semiconductor equipment is packaged for delivery to the cleaning center. To avoid further contamination of the part, it is preferable to open the part in a controlled clean environment.

In a UPW control operation 404, the particles currently present in the ultra pure water are measured. The liquid particle test process 400 uses ultra pure water (UPW) as the carrier medium to determine the impurity level for a particular semiconductor equipment part. As a control, the level of particles present in the UPW is determined before the part is placed in the water. Subsequently, the new part can be ultrasonicated to dislodge particles that are adhered to its surface into the UPW. The UPW can then be retested, with the particle count difference being attributable to the part itself.

In a UPW application operation 406, a known volume of the UPW is applied to a cavity of the part to be analyzed. The cavity of the part is essentially the area of the part which provides the best test area for analyzing the impurity level of the part.

Next, in a UPW extraction operation 408, the UPW is extracted from the part and introduced into a liquid particle counter. After introducing the UPW to the cavity of the part, the UPW gathers particles from the surface of the part. Thus, by knowing the particle level of the UPW before being introduced into the cavity of the part, and then measuring the amount of particles in the UPW after being introduced into the cavity of the part, the impurity level of the part can be determined.

The analysis of the impurity level for the part is then begun, in an analysis operation 410.

Then, after the liquid particle counter stabilizes, the impurity level data is collected, in a data collection operation 412. Initially, the data is collected in particle size. Thereafter, the data is normalized over the surface area of the semiconductor part being analyzed.

The impurity level data is then processed in a data processing operation 414. The particles are measured both in terms of size distribution and quantity. The quantity could be in thousands of counts down to single digits. The distribution can be as low as about 0.05 microns up to about 10 microns. Preferably, the particle counts are "bucketed" into specified size ranges of interest to assist in analysis. The result is the number of particles per volume of solution or particles per $cm^2$.

Finally, post-process operations occur in operation 416. Post-process operations include using the impurity level information to aid in further processing of the part and other post-process operations that will be apparent to those skilled in the art.

In view of the foregoing, a method for determining contamination of an openable part having inner surfaces includes introducing a part into a controlled clean environment of at least class 1000, opening the part in the controlled clean environment and running contamination analysis on the inner surfaces of the part.

The method can also include applying a known volume of ultra pure water to a cavity of a part, extracting the water, and analyzing contaminants found in the water. The method can additionally include applying a known volume of a high purity extraction solution to a cavity of a part, extracting the extraction solution, and analyzing contaminants found in the extraction solution.

Figure 5:
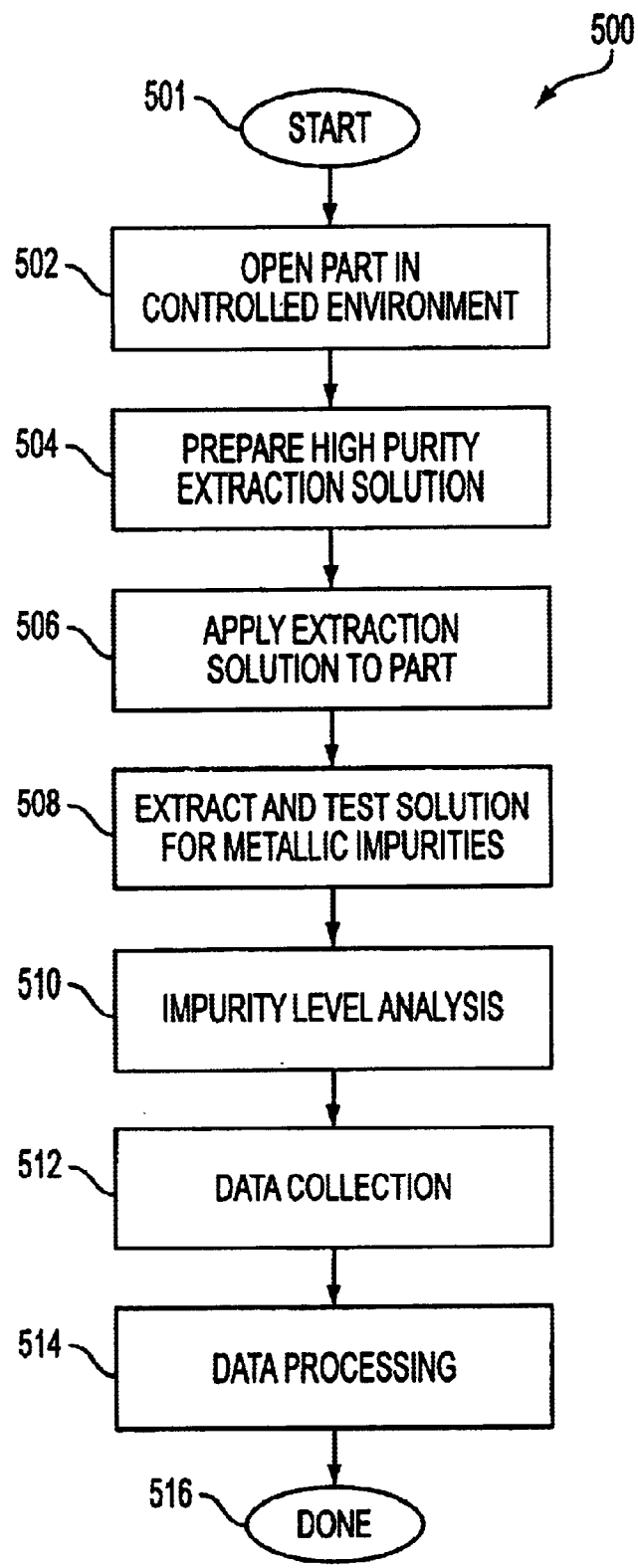
FIG. 5 is a flowchart showing an acid extraction/ICP-MS technique of a new or clean part, in accordance with an embodiment of the present invention.

FIG. 5 is a flowchart showing an acid extraction/ICP-MS technique 500 of a new or clean part, in accordance with en embodiment of the present invention. In an initial operation 501, pre-process operations are performed. Pre-process operations include determining the specification of characteristics for a clean part, and other pre-process operations that will be apparent to those skilled in the art. This process is applicable, for example, to operations 106 and 112 of FIG. 1.

Next, in a cleanroom operation 502, the semiconductor equipment part to be cleaned is opened in a cleanroom. Upon being disassembled, semiconductor equipment is packaged for delivery to the cleaning center. To avoid further contamination of the part, it is preferable to open the part in a controlled clean environment.

In an acidic extraction control operation 504, the analytical test process 500 uses a high purity extraction solution (e.g. 1.25% wt HF, 3% wt $H_2O_2$ and 0.125% wt $HNO_3$) to determine the metallic impurity level for a particular semiconductor equipment part. As a control, the level of metallic impurities present in the extraction solution is determined by ICP-MS. Subsequently, a selection area of the new part is extracted with the high purity extraction solution. The extract is then retested, with the metallic level difference being attributable to the part itself.

In a operation 506, a known volume of the high extraction solution is applied to a cavity of the part to be analyzed. The cavity of the part is essentially the area of the part which provides the best test area for analyzing the impurity level of the part.

Next, in a operation 508, the high purity extraction solution is extracted from the part and introduced into an ICP-MS. After introducing the high purity extraction solution to the cavity of the part, the extraction solution gathers metallic impurities from the surface of the part. Thus, by knowing the metallic level of the extraction solution before being introduced into the cavity of the part, and then measuring the amount of particles in the extraction solution after being introduced into the cavity of the part, the impurity level of the part can be determined. The acid extraction/ICP-MS technique is then completed with operation 510.

The analysis of the impurity level for the part is then begun, in an analysis operation 510.

Then, after the ICP-MS stabilizes, the impurity level data is collected, in a data collection operation 512. Initially, the data is collected in ppbw (parts per billion wt). Thereafter, the data is normalized over the surface area of the semiconductor part being analyzed.

The impurity level data is then processed in a data processing operation 514. The metallic impurities are measured both in terms of concentration in ppbw for each type of trace metals. The area of the part that is extracted is calculated and the result is normalized atoms per $cm^2$ or $ng/cm^2$.

Finally, post-process operations occur in operation 516. Post-process operations include using the impurity level information to aid in further processing of the part and other post-process operations that will be apparent to those skilled in the art.

Figure 6:
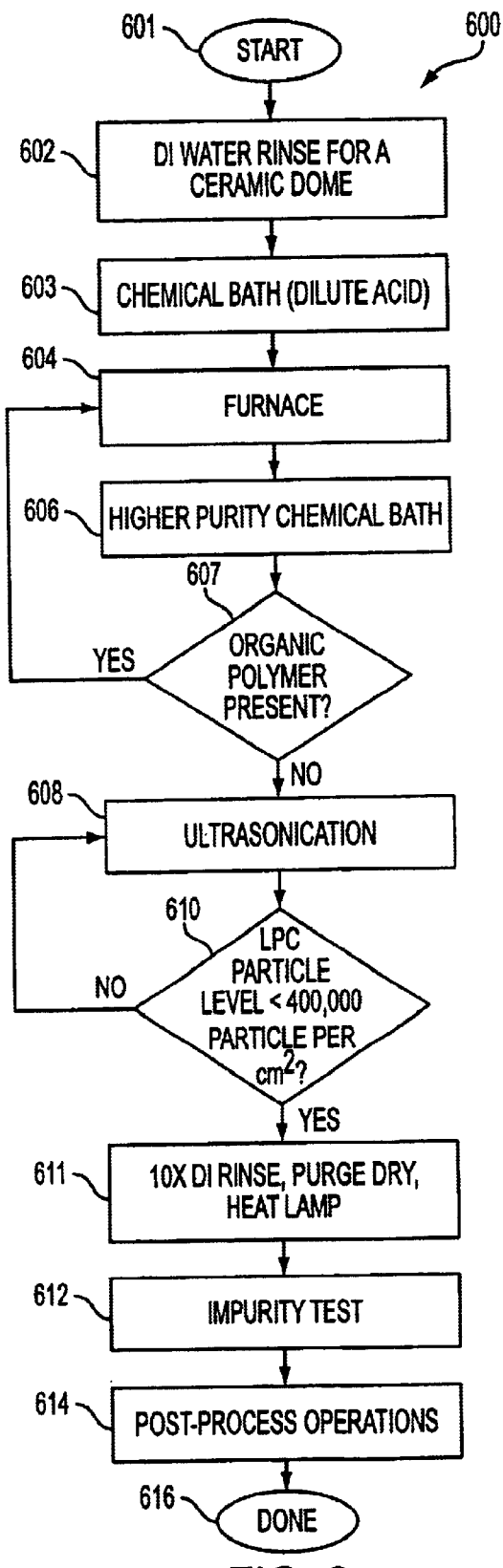
FIG. 6 is a flowchart showing a cleaning process 110, in accordance with one aspect of the present invention, to remove resistant organic polymer and metallic impurities from a high purity ceramic dome.

FIG. 6 is a flowchart showing a cleaning process 600, in accordance with one aspect of the present invention, to remove resistant organic polymer and metallic impurities from a high purity ceramic dome (>99% $Al_2O_3$). In an initial operation 601, pre-process operations are performed. Pre-process operations include determining the particular characteristics of the part to be processed and other pre-process operations that will be apparent to those skilled in the art.

In operation 602, the ceramic dome is DI water sprayed rinse to remove loose polymers, particles and metallic impurities. Initially, the ceramic dome is unpacked, recorded, and photographed to record the initial condition of the dome. The ceramic dome is then placed in a chemical bath 603 for about 2 hours. The chemical bath is preferably an dilute $HF/HNO_3$ chemical bath, which is heated to about 60–80° C. The concentration of HF is less than 5% wt and $HNO_3$ is less than 10% wt. The hot acid dissolves Si—O and Al—O bonds and breaks other metallic bonds. Thereafter it is removed from the chemical bath, DI spray rinsed and dried with a cleanroom wipe or with a heat lamp until no moisture is observed on the inside or outside of the dome. It has been found to be very important to do the pre-treatment step 603 before putting the part into the furnace in order to dissolve the Si—O and Al—O bonds. This advantageously reduces the amount time the part has to be in the furnace of the next operation.

In a heating operation 604, the dome is heated in a furnace. In this operation, the dome is placed in a furnace and heated to about 700–800° C. for about 6–12 hours. After about 6–12 hours, the furnace is turned off. To avoid damage to the dome, the furnace should generally not be opened until the temperature reaches below 200° C. Opening the furnace earlier may result in the dome being cracked. After the temperature reaches below 200° C., the furnace may be opened and allowed to cool to below 80° C. The dome is then withdrawn from the furnace when the temperature reaches below 80° C.

Next, in a bath operation 606, the dome is placed in another chemical bath. The chemical bath is also an $HF/HNO_3$ chemical bath, which is heated to about 80° C. The concentration of HF and $HNO_3$ is the same as the first bath but is kept clean and is prepared from higher purity chemicals. The dome is placed in the chemical bath for about 6–8 hours to dissolve any residual carbon and silicon/aluminum oxides and any other metallic impurities. After this step, it is placed in an acid waste tank and rinsed with deionized water to remove any residual acids. Thereafter, the dome is preferably visually inspected 607 to determine the cleanliness of the part. If organic polymer is still observed, the operations 604/606 are repeated.

In an ultrasonication operation 608, the dome is ultrasonicated in deionized water. Once a visual inspection has been made of the dome, it is ultrasonicated in a fresh overflowing deionized water bath for about two hours. In the operation 610, the dome is tested by LPC technique. As stated previously, this impurity testing operation helps in determining whether the part has been cleaned to have characteristics in accordance with the predetermined clean specification. If the particle level as measured by LPC technique is less than 400,000 particle per $cm^2$, the dome is then rinsed in deionized water approximately 10 times, and thereafter purged dry with filtered $N_2$ and further under a heat lamp 611 for at least 1 hour. The process 608 can be repeated if the dome has not attained the specified levels of impurity The part is then further tested for impurities, in a testing operation 612. Preferably, a surface particle test is performed on the dome using a Dryden QIII particle counter.

After testing adequately to the predetermined specification, the part is packaged with cleanroom double bags in the cleanroom.

Finally, in operation 614, various post-process operations are performed. Post-process operations include testing the dome in fully assembled semiconductor fabrication equipment, and other post-process operations that will be apparent to those skilled in the art. After the post-process operations are completed, process 600 is completed with operation 616.

It will therefore be appreciated that a method for cleaning ceramic parts includes immersing a ceramic part into a first chemical bath to damage contaminant bonds, heating the ceramic part in a furnace after the contaminant bonds are damaged and immersing the ceramic part in a second chemical bath to remove contaminants. Also, the first chemical bath can be a dilute chemical bath including HF and $HNO_3$ which is heated to about 60–80° C.

Figure 7:
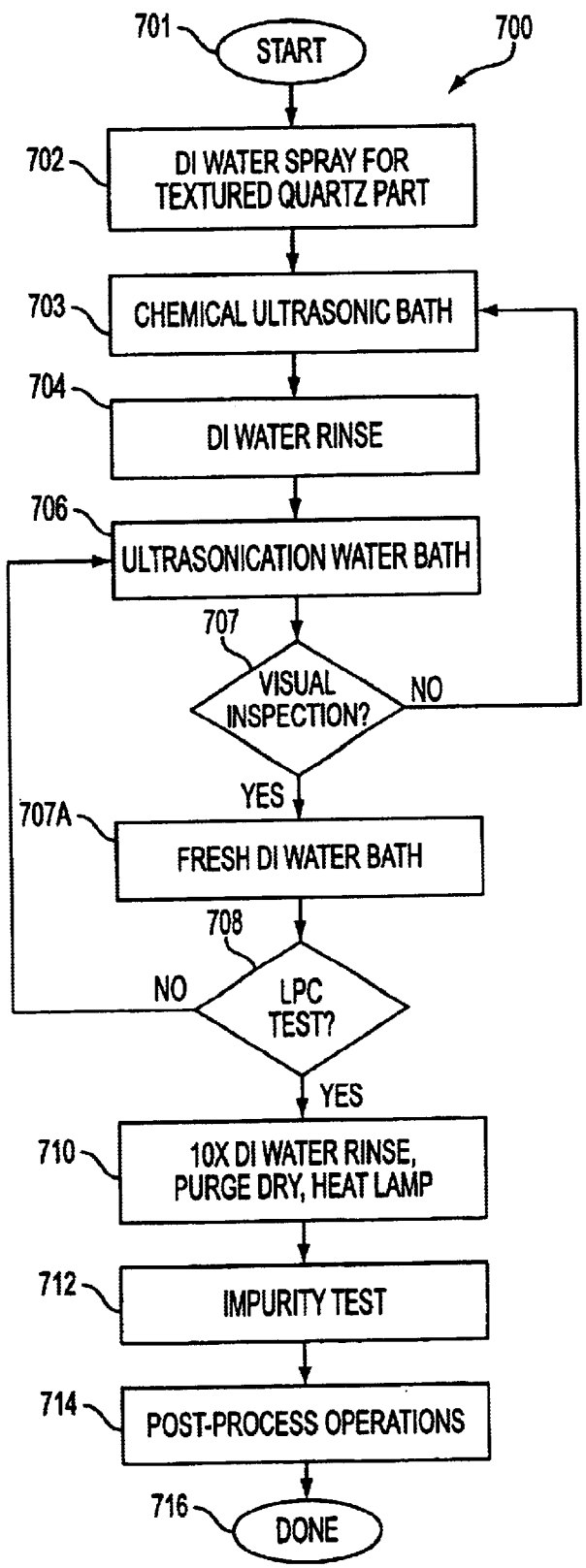
FIG. 7 is a flowchart showing a cleaning process 110, in accordance with one aspect of the present invention to remove particle from a textured high purity quartz surface.

FIG. 7 is a flowchart showing a cleaning process 700, in accordance with one aspect of the present invention to remove particle from a textured high purity quartz surface. In an initial operation 701, pre-process operations are performed. Pre-process operations include determining the particular characteristics of the part to be processed and other pre-process operations that will be apparent to those skilled in the art.

In an operation 702, the high purity quartz part is DI water spray rinsed to remove loose polymers, particles and metallic impurities. Initially, the quartz part is unpacked, recorded, and photographed to record the initial condition of the dome. The quartz part is then placed in a chemical bath 703 and ultrasonicated for 15 min. The chemical bath is preferably a concentrated $HF/HNO_3$ chemical bath. The concentration of HF is about 25% wt and $HNO_3$ about 35% wt. The concentrated acid in the presence of ultrasonication energy dissolves a layer of damaged quartz to lower the particle counts on the quartz part surface. Thereafter it is removed from the chemical bath and DI spray rinsed in an operation 704.

Next, in a DI ultrasonication operation 706, the quartz is ultrasonicated in deionized water to further remove particles. Once a visual inspection 707 has been made of the quartz part, it is ultrasonicated in a fresh deionized water bath 707A for 15 min. If the part does not pass the visual inspection test, the part goes back to operation step 703 for additional cleaning. In the operation 708, the quartz is tested by LPC technique. As stated previously, this impurity testing operation helps in determining whether the part has been cleaned to have characteristics in accordance with the predetermined clean specification. If the particle level as measured by LPC technique is less than 200,000 particle per $cm^2$, the quartz part is then rinsed in deionized water approximately 10 times, and thereafter purged dry with filtered $N_2$ and further under a heat lamp for at least 1 hour in an operation 710. The process 706 can be repeated if the dome has not attained the specified levels of impurity The part is then further tested for impurities, in a testing operation 712. Preferably, a surface particle test is performed on the dome using a Dryden QIII particle counter. After testing adequately to the predetermined specification, the part is packaged with cleanroom double bags in the cleanroom.

Finally, in operation 714, various post-process operations are performed. Post-process operations include testing the dome in fully assembled semiconductor fabrication equipment, and other post-process operations that will be apparent to those skilled in the art. After the post-process operations are completed, process 700 is completed with operation 716.

Figure 8:
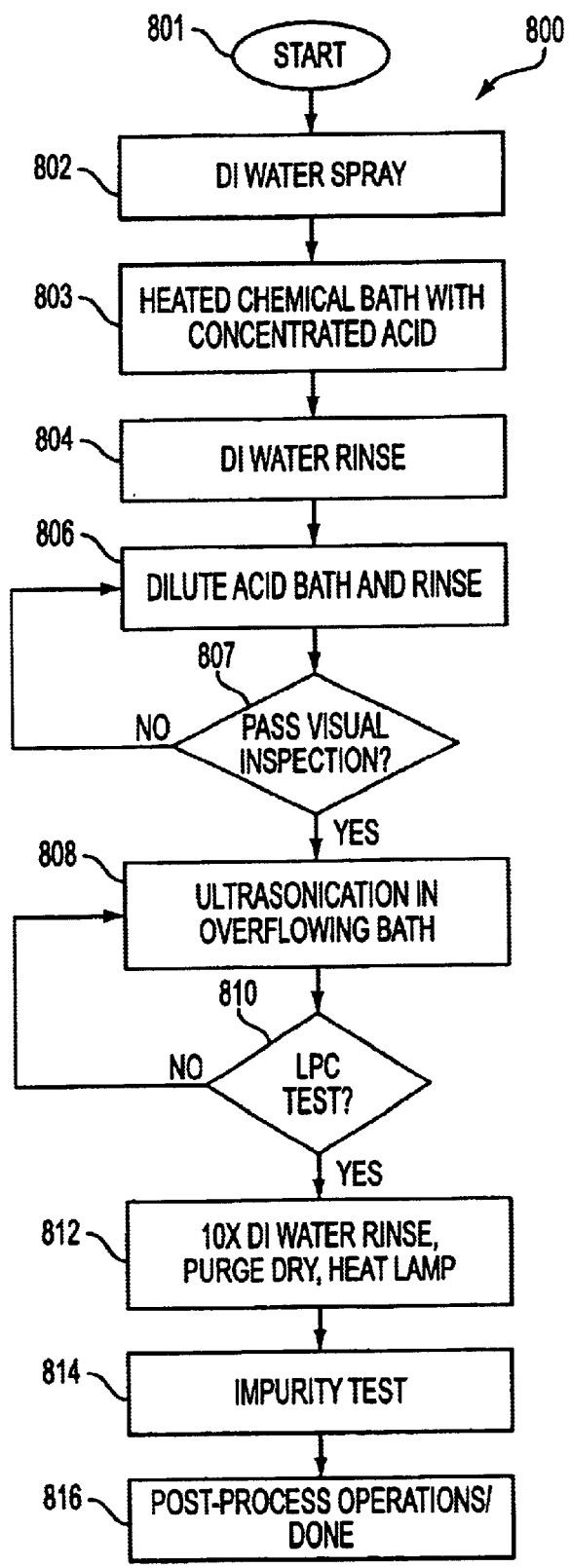
FIG. 8 is a flowchart showing a cleaning process 110, in accordance with one aspect of the present invention to remove particle and metallic impurities from a textured high purity ceramic (>99% $Al_2O_3$) surface.

FIG. 8 is a flowchart showing a cleaning process 800, in accordance with one aspect of the present invention to remove particle and metallic impurities from a textured high purity ceramic (>99% $Al_2O_3$) surface. In an initial operation 801, pre-process operations are performed. Pre-process operations include determining the particular characteristics of the part to be processed and other pre-process operations that will be apparent to those skilled in the art.

In an operation 802, the ceramic dome is DI water sprayed rinse to remove loose polymers, particles and metallic impurities. Initially, the ceramic dome is unpacked, recorded, and photographed to record the initial condition of the dome. The ceramic dome is then placed in a chemical bath 803 for about 2 hours. The chemical bath is preferably a concentrated $H_2SO_4/H_2O_2$ or $H_2SO_4/H_3PO_4$ chemical bath, which is heated to about 140–180° C. The concentration of $H_2SO_4$ is about 50% wt, H2O2 is about 15% wt and $H_3PO_4$ about 40% wt. The hot concentrated acid dissolves a layer of damaged alumina to lower the particle counts on the dome surface. Thereafter it is removed from the chemical bath and DI spray rinsed in an operation 804.

Next, in a bath operation 806, the dome is placed in another chemical bath. The chemical bath is a dilute $HF/HNO_3$ chemical bath. The concentration of HF and $HNO_3$ is less than 5% wt and 10% wt respectively to remove metallic impurities. After this step, it is placed in an acid waste tank and rinsed with deionized water to remove any residual acids. Thereafter, the dome is preferably visually inspected 807 to determine the cleanliness of the part. If the part still needs more cleaning, operation 806 is repeated.

In an ultrasonication operation 808, the dome is ultrasonicated in deionized water. Once a visual inspection has been made of the dome, it is ultrasonicated in a fresh overflowing deionized water bath for about two hours. In the operation 810, the dome is tested by LPC technique. As stated previously, this impurity testing operation helps in determining whether the part has been cleaned to have characteristics in accordance with the predetermined clean specification. If the particle level as measured by LPC technique is less than 500,000 particle per $cm^2$, the dome is then rinsed in deionized water approximately 10 times, and thereafter purged dry with filtered $N_2$ and further under a heat lamp for at least 1 hour in an operation 812. The process 808 can be repeated if the dome has not attained the specified levels of impurity.

The part is then further tested for impurities, in a testing operation 814. Preferably, a surface particle test is performed on the dome using a Dryden QIII particle counter. After testing adequately to the predetermined specification, the part is packaged with cleanroom double bags in the cleanroom.

Finally, in operation 816, various post-process operations are performed. Post-process operations include testing the dome in fully assembled semiconductor fabrication equipment, and other post-process operations that will be apparent to those skilled in the art.

In view of the foregoing it will be appreciated that a method for cleaning textured quartz parts includes immersing a textured quartz part into an ultrasonic chemical bath, immersing the textured quartz part into an ultrasonication water bath and immersing said textured quartz part into a deionized water bath. The method can also include immersing the part in an ultrasonification overflowing bath.

It will further be appreciated that a method for determining the cleanliness of semiconductor fabrication equipment parts includes testing the parts before a cleaning process for at least one of particles, metallic impurities and organics. The parts are tested after certain steps in the cleaning process for at least one of particles, metallic impurities and organics. The parts are tested a final time after a final cleaning step for at least one of particles, metallic impurities and organics.

Also, a method for removing particles on a textured surface of a semiconductor fabrication equipment part includes determining a chemical bonding characteristic of the particles, identifying a type of particles embedded in the textured surface, measuring a depth of any subsurface damage and performing a combination of ultrasonication and chemical etching to the textured surface.

While the present invention has been described in terms of several preferred embodiments, there are many alterations, permutations, and equivalents which may fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A process for cleaning semiconductor fabrication equipment parts comprising:
    determining a definition for a clean part including multiple maximum impurity levels;
    determining an initial multiple impurity levels of a part prior to its cleaning;
    determining a cleaning process to apply to the part;
    applying the cleaning process to the part, wherein the cleaning process creates reduced multiple impurity levels for the part below that of said initial multiple impurity levels;
    determining said reduced multiple impurity levels;
    comparing said reduced multiple impurity levels against said multiple maximum acceptable impurity levels of said definition; and
    repeating the application of said cleaning process to said part if said reduced multiple impurity levels do not meet said definition of a clean part.

2. A process as recited in claim 1, further comprising testing the part in reassembled equipment in which the part was designed to operate.

3. A process as recited in claim 2, further comprising repeating a cleaning process on the part if the part does not function properly in the reassembled equipment.

4. A process as recited in claim 1, wherein at least one impurity level is determined utilizing a surface particle test.

5. A process of claim 1, wherein at least one impurity level is determined using a liquid particle test.

6. A process of claim 1, wherein at least one impurity level is determined by using acid-extraction ICP-MS.

7. A process as recited in claim 1 wherein the cleaning process employs a dilute aqueous cleaning solution comprising:
    0.5–1.5% wt HF;
    0.1–0.5% wt. $HNO_3$; and
    1–10% wt. $H_2O_2$.

8. A process as recited in claim 7 wherein a concentration of $H_2O_2$ is no greater than about 5% wt.

9. A process as recited in claim 1 wherein the cleaning process comprises:
    determining how deep is a sub-surface damage beneath a surface of said part;
    chemically etching said surface said part; and
    stopping said chemical etching of said surface at about a depth of said sub-surface damage.

10. A process as recited in claim 1 wherein the cleaning process comprises:
    performing an ultrasonication cleaning process to a surface of said part to be cleaned;
    spray rinsing said part with a dilute chemical mixture; and
    spray rinsing said part with deionized water.

11. A process as recited in claim 10 further comprising repeating said spray rinsing of said part with a dilute chemical mixture and spray rinsing said part with deionized water based upon a specification of purity for said part.

12. A process as recited in claim 1 wherein determining said initial impurity level of said part comprises:
    introducing said part into a controlled clean environment of at least class 1000;
    opening said part in said controlled clean environment; and
    running contamination analysis on inner surfaces of said port.

13. A process as recited in claim 12 wherein running contamination analysis includes applying a known volume of ultra pure water to a cavity of said part, extracting said water and analyzing contaminants found in said water.

14. A process as recited in claim 12 wherein running contamination analysis includes applying a known volume of a high purity extraction solution to a cavity of said part, extracting said extraction solution and analyzing contaminants found in said extraction solution.

15. A process as recited in claim 1 wherein the part is a ceramic part and the cleaning process comprises:
    immersing said ceramic part into a first chemical bath to damage contaminant bonds;
    heating said ceramic part in a furnace after said contaminant bonds are damaged; and
    immersing said ceramic part in a second chemical bath to remove contaminants.

16. A process as recited in claim 15 wherein said first chemical bath is a dilute chemical bath including HF and $HNO_3$ which is heated to about 60–80° C.

17. A process as recited in claim 1 wherein the cleaning process used for a textured quartz part comprises:
    immersing said textured quartz part into an ultrasonic chemical bath;
    immersing said textured quartz part into an ultrasonication water bath; and
    immersing said textured quartz part into a deionized water bath.

18. A process as recited in claim 1 wherein the part further comprises a textured ceramic surface and the cleaning process used for cleaning metallic impurities from the textured ceramic surface comprises:
    immersing said part having the textured ceramic surface into a heated chemical bath;
    rinsing said part in deionized water;
    immersing said part in a dilute acid bath and rinsing;
    visually inspecting said part; and
    repeatedly immersing said part in said dilute acid bath until it passes visual inspection.

19. A process as recited in claim 18 further comprising immersing said part in an ultrasonification overflowing bath.

20. A process as recited in claim 1 wherein determining the definition for said clean part comprises:
    testing said part before the cleaning process for at least one of particles, metallic impurities and organics;
    testing said part after certain steps in the cleaning process for at least one of particles, metallic impurities and organics; and
    testing the part after a final cleaning step of the cleaning process for at least one of particles and organics.

21. A process as recited in claim 1 where in said cleaning process is used to remove particles on a textured surface of said part and determining said cleaning process comprises:
    determining a chemical bonding characteristic of the particles;
    identifying a type of particles embedded in said textured surface;
    measuring a depth of any subsurface damage; and
    performing a combination ultrasonification and chemical etching to the textured surface based upon said chemical bonding characteristics, said type of particles and said depth of subsurface damage.

* * * * *